(12) United States Patent
Kuo et al.

(10) Patent No.: US 11,791,336 B2
(45) Date of Patent: Oct. 17, 2023

(54) BENT FIN DEVICES

(71) Applicant: Taiwan Semiconductor Manufacturing Co., Ltd., Hsinchu (TW)

(72) Inventors: Jiun-Ming Kuo, Taipei (TW); Pei-Ling Gao, Hsinchu (TW); Chen-Hsuan Liao, Hsinchu (TW); Hung-Ju Chou, Taipei (TW); Chih-Chung Chang, Nantou County (TW); Che-Yuan Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 372 days.

(21) Appl. No.: 17/021,251

(22) Filed: Sep. 15, 2020

(65) Prior Publication Data
US 2021/0257360 A1    Aug. 19, 2021

Related U.S. Application Data

(60) Provisional application No. 62/978,500, filed on Feb. 19, 2020.

(51) Int. Cl.
*H01L 21/8234* (2006.01)
*H01L 27/088* (2006.01)
*H01L 29/06* (2006.01)

(52) U.S. Cl.
CPC .. *H01L 27/0886* (2013.01); *H01L 21/823431* (2013.01); *H01L 21/823481* (2013.01); *H01L 29/0653* (2013.01)

(58) Field of Classification Search
None
See application file for complete search history.

(56) References Cited

U.S. PATENT DOCUMENTS

| 8,796,666 | B1 | 8/2014 | Huang et al. |
| 9,093,530 | B2 | 4/2015 | Huang et al. |
| 9,548,303 | B2 | 1/2017 | Lee et al. |
| 2015/0004772 | A1* | 1/2015 | Tsai ............... H01L 21/76224 438/424 |
| 2017/0047326 | A1* | 2/2017 | You ............... H01L 29/66795 |
| 2018/0096992 | A1* | 4/2018 | Bi ............... H01L 21/31144 |
| 2018/0190821 | A1 | 7/2018 | Kim et al. |
| 2018/0226343 | A1* | 8/2018 | Cheng ............ H01L 23/5256 |
| 2018/0308764 | A1* | 10/2018 | Bi ............... H01L 29/66666 |
| 2018/0366583 | A1 | 12/2018 | Kim et al. |
| 2019/0206853 | A1* | 7/2019 | Zhang ........... H01L 27/11807 |

FOREIGN PATENT DOCUMENTS

TW          201816857 A      5/2018

* cited by examiner

*Primary Examiner* — Joseph C. Nicely
*Assistant Examiner* — Lamont B Koo
(74) *Attorney, Agent, or Firm* — HAYNES AND BOONE, LLP

(57) ABSTRACT

Semiconductor devices and methods of forming the same are provided. In an embodiment, a semiconductor device includes a first fin extending along a first direction, a second fin extending parallel to the first fin, and a gate structure over and wrapping around the first fin and the second fin, the gate structure extending along a second direction perpendicular to the first direction. The first fin bents away from the second fin along the second direction and the second fin bents away from the first fin along the second direction.

20 Claims, 19 Drawing Sheets

BENT FIN DEVICES

PRIORITY DATA

This application claims priority to U.S. Provisional Patent Application No. 62/978,500 filed on Feb. 19, 2020, entitled "BENT FIN DEVICES", the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

The scaling down of the semiconductor devices also reduces spacing between device features, making it difficult to fill in materials or remove materials from between device features. For example, gate replacement processes may be used to fabricate a fin-type field effect transistor (FinFET). A dummy gate is first formed over the fins to undergo a substantial potential of fabrication processes and is later removed and replaced with a functional gate. Such gate replacement processes therefore require filling in dummy gate material between fins, removing dummy gate material between fins, and filling in functional gate material between fins. When fin-to-fin spacing is reduced, the filling in and removing of material between fins may become challenging. Incomplete fill-in or removal of material may lead to device defects, reduced device performance and reduced yield. Therefore, while conventional techniques to form semiconductor devices are generally adequate for their intended purposes, they are not satisfactorily in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A-1, 5A-2, 5B, 6A-1, 6A-2, 6B, 7A, 7B, 8A, 8B, 9A, and 9B are fragmentary schematic cross-sectional views of a workpiece at various fabrication stages, such as those associated with the method in FIG. 1, according to various aspects of the present disclosure.

DETAILED DESCRIPTION

Figure 1:
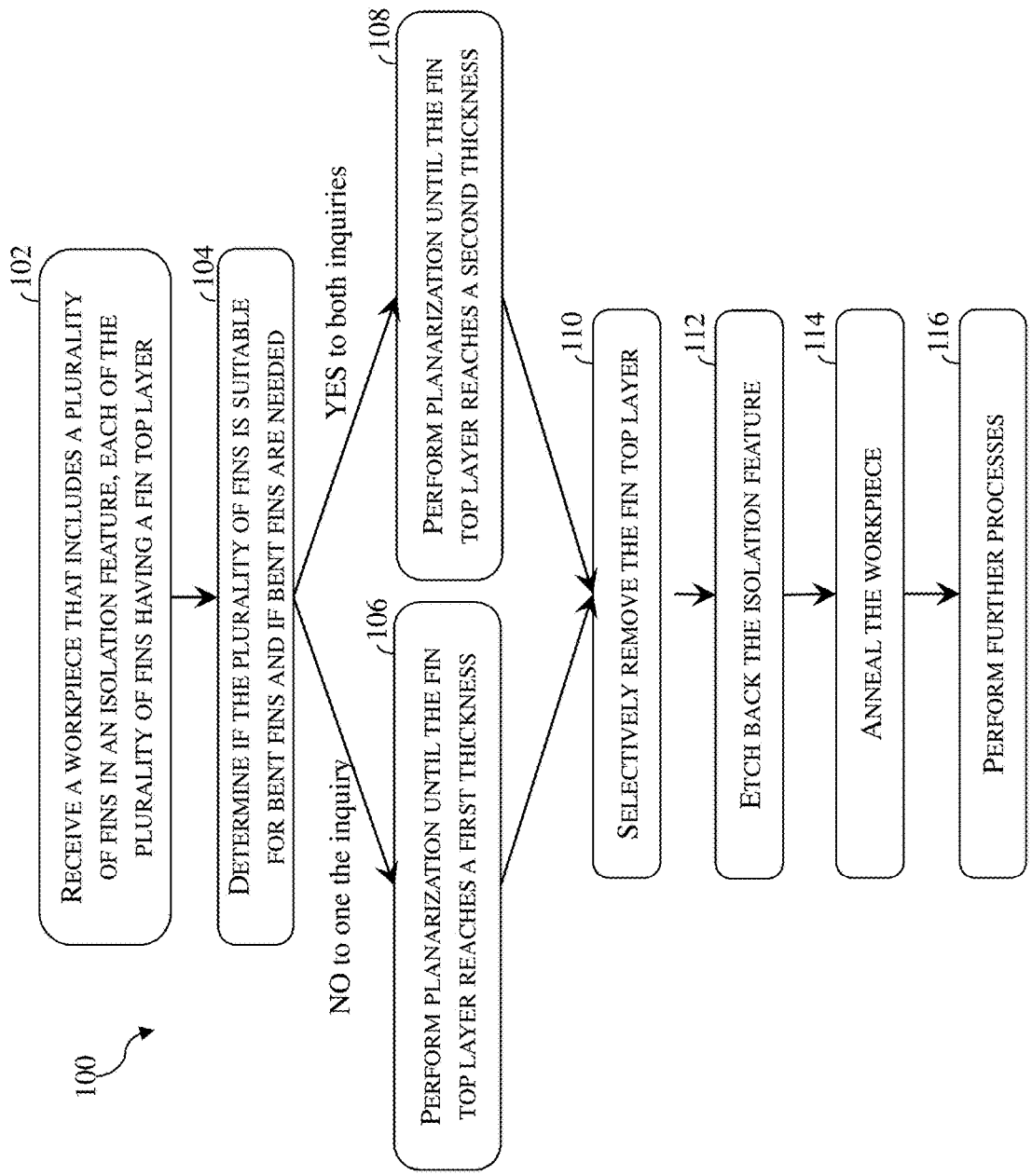
FIG. 1 is a flowchart of a method for fabricating a semiconductor device, according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is related to a structure of or a process to form a FinFET. Particularly, the present disclosure is related to a FinFET device that includes bent fins to improve gate formation process windows. As described above, the scaling down of semiconductor devices has its fair share of challenges in many aspects. One of the challenges lies with formation of gate structures that wrap around fin-shaped semiconductor features (or fins). A FinFET is a kind of multi-gate devices where a gate structure engages more than one surface/side of the fins to provide improved channel control and to combat short channel effect (SCE). As spacing between fins shrinks, the recess between adjacent fins may have increased aspect ratio, making it more and more difficult to deposit dummy/functional gate material between adjacent fins or remove dummy gate material between adjacent fins. The present disclosure provides a semiconductor device where two adjacent fins are bent away from one another to increase the spacing therebetween to improve the process window of gate formation. The present disclosure also provides a method to determine if the bent fins should be implemented. The bent fins of the semiconductor device of the present disclosure help satisfactorily scaling down FinFETs and do not hinder subsequent processes.

The various aspects of the present disclosure will now be described in more detail with reference to the figures. FIG. 1 is a flowchart of a method 100 for fabricating a semiconductor device according to various aspects of the present disclosure. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the fragmentary cross-sectional views of a workpiece 200 shown in FIGS. 2, 3A, 3B, 4A, 4B, 5A-1, 5A-2, 5B, 6A-1, 6A-2, 6B, 7A, 7B, 8A, 8B, 9A, and 9B. Because a semiconductor device will be formed from the workpiece 200, the workpiece 200 may be referred to as semiconductor device 200 as the context requires.

The semiconductor device 200 may be included in a microprocessor, a memory, and/or other integrated circuit (IC) device. In some implementations, the semiconductor device 200 may be a portion of an IC chip, a system on chip (SoC), or portion thereof, that includes various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Illustrations of the semiconductor device 200 in FIGS. 2, 3A, 3B, 4A, 4B, 5A-1, 5A-2, 5B, 6A-1, 6A-2, 6B, 7A, 7B, 8A, 8B, 9A, and 9B have been simplified for the sake of clarity to better understand the inventive concepts of the present disclosure. Additional features can be added in semiconductor device 200, and some of the features described below can be replaced, modified, or eliminated in other embodiments of semiconductor device 200.

Figure 2:
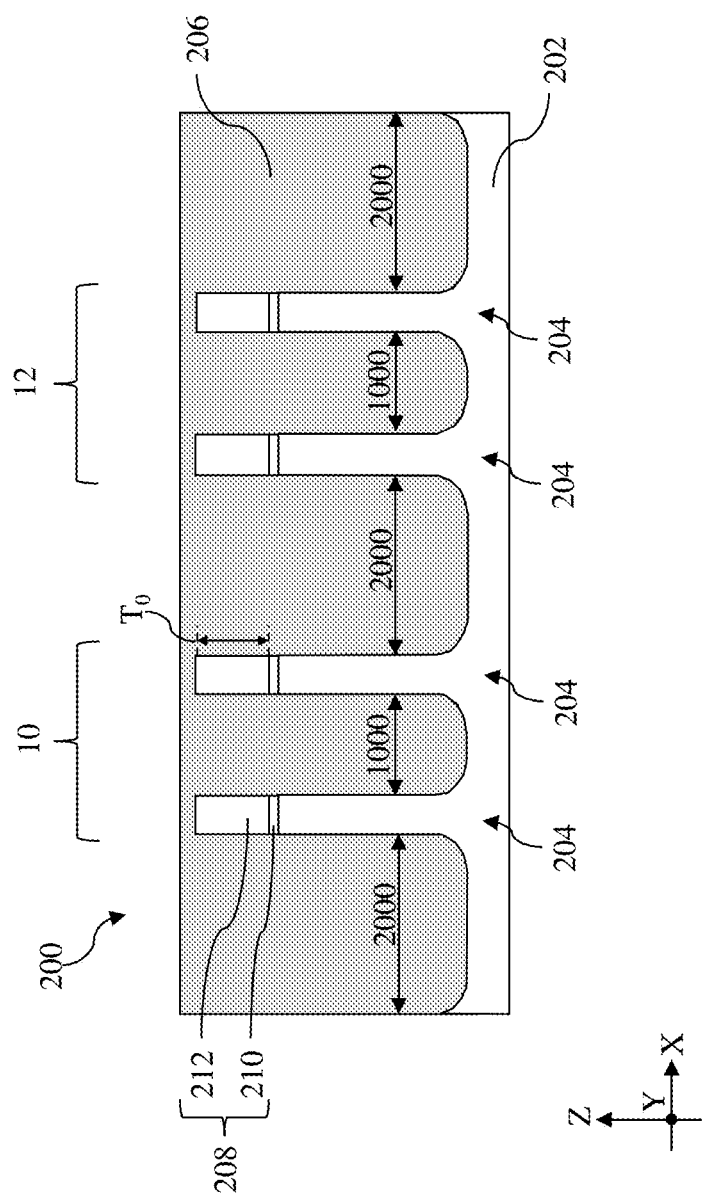

Referring to FIGS. 1 and 2, method 100 includes a block 102 where a workpiece 200 that includes a plurality of fins 204 in an isolation feature 206. The workpiece 200 includes a substrate 202. In the depicted embodiment, substrate 202 is a bulk substrate that includes silicon. Alternatively, in some implementations, substrate 202 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. Alternatively or additionally, the bulk substrate 202 and/or the one or more material layers include another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-V materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

As shown in FIG. 2, the workpiece 200 includes a plurality of fins 204 that are embedded in the isolation feature 206. In some embodiments, the plurality of fins 204 may be formed using one or more photolithography processes and one or more etching processes. In some implementations, the plurality of fins 204 may be formed using a single patterning process or a multiple-patterning process. Examples of multiple-patterning processes include a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. To form the plurality of fins 204, a hard mask layer 208 (or a fin top hard mask layer 208) is first deposited over the substrate 202. The hard mask layer 208 may be a single layer or a multi-layer. FIG. 2 illustrates a multi-layer hard mask layer 208 that includes a first fin top layer 210 and a second fin top layer 212. In some instances, the first fin top layer 210 may be formed of silicon oxide or other suitable material and the second fin top layer 212 may be formed of silicon nitride, silicon oxynitride, silicon carbonitride, or other suitable dielectric material. The first fin top layer 210 and the second fin top layer 212 are formed of different materials to impart different etching selectivities in the first fin top layer 210 and the second fin top layer 212. In one embodiment, the first fin top layer 210 is formed of silicon oxide and the second fin top layer 212 is formed of silicon nitride. The first fin top layer 210 and the second fin top layer may be deposited using chemical vapor deposition (CVD), atomic layer deposition (ALD), or other suitable method.

An example multi-patterning process for forming the plurality of fins 204 is described here. A sacrificial layer is deposited over the hard mask layer 208. In one embodiment, the sacrificial layer may be a silicon oxide layer deposited using CVD, ALD, or a suitable method. Then, the sacrificial layer is patterned using a photolithography process to form mandrel features. A photoresist layer (not shown) is deposited over the sacrificial layer using spin coating and then the photoresist layer is baked in a pre-exposure baking process. The photoresist layer may be a single layer or a multi-layer, such as a tri-layer. The pre-baked photoresist layer is then exposed to a radiation reflected from or transmitting through a photomask with a pattern. The exposed photoresist layer is then baked in a post-exposure baking process and developed in a developing process. The radiation source may be an excimer laser light source, an ultraviolet (UV) source, a deep UV (DUV) source, or an extreme UV (EUV) source. Because the photoresist layer is selected to be sensitive to the radiation, exposed (or non-exposed) portions of the photoresist layer undergo chemical changes to become soluble in a developer solution during the developing process. The resultant patterned photoresist layer carries a pattern that corresponds to that of the mask. The patterned photoresist layer can then be used as an etch mask during an etching process to remove portions of the underlying sacrificial layer. The etching process can include a dry etching process (for example, a reactive ion etching (RIE) process), a wet etching process, other suitable etching process, or combinations thereof. After the etching process, the patterned photoresist layer can be removed by ashing or a suitable method. Alternatively, the exposure process can implement maskless lithography, electron-beam writing, ion-beam writing and/or nanoprint technology. After the patterned photoresist layer is removed, mandrel features, which are patterned from the sacrificial layer, are formed over the hard mask layer 208.

A spacer layer is then blanketly deposited over the workpiece 200, including over the mandrel features. The spacer layer is deposited along top surfaces and sidewalls of the mandrel features. In some embodiments, the spacer layer may be formed of a material that has an etching selectivity different from that of the mandrel features such that the mandrel features may be selectively removed at a subsequent process. For example, the spacer layer may be formed of silicon nitride, silicon oxynitride, silicon carbonitride, silicon carbide, or other suitable materials. The spacer layer is then etched back to expose top surfaces of the mandrel features. In some implementations, the etch back of the spacer layer leaves behind vertical portions of the spacer layer that extend along sidewalls of the mandrel features while horizontal portions of the spacer layer that cover the top surface of the hard mask layer 208 is removed. The exposure of the mandrel features allows the mandrel features to be selectively removed, thereby forming the plurality of spacer features over the hard mask layer 208. The plurality of spacer features is then used as an etch mask to etch the hard mask layer 208 to form a patterned hard mask layer 208. The patterned hard mask layer 208 is then applied as an etch mask to pattern the substrate 202 (or semiconductor layers deposited over the substrate 202) to form the plurality of fins 204. In some embodiments, some of the plurality of fins 204 may be formed of silicon for subsequent formation of n-type FinFETs and some of the plurality of fins 204 may include silicon and germanium for subsequent formation of p-type FinFETs. In some other embodiments where exposure process has sufficient resolution, a photoresist layer is formed directly over the hard mask layer 208 and a photolithography process is used to pattern the photoresist layer. The patterned photoresist layer is then used as an etch mask to pattern the substrate 202 (or semiconductor layers deposited over the substrate 202) to form the plurality of fins 204. An exposure process with sufficient resolution may include use of maskless lithography, electron-beam writing, ion-beam writing, or EUV lithography. Due its composition, each of the plurality of fins 204 may be referred to as a semiconductor fin.

To isolate the plurality of fins 204 from one another, an isolation feature 206 is deposited over the workpiece 200, including over the plurality of fins 204 as well as the fin top layers 210 and 212. In some embodiments, the isolation feature 206 may be a shallow trench isolation (STI) layer formed of a silicon-oxide-based material that is deposited using flowable chemical vapor deposition (FCVD) or other suitable method. Example precursors for the FCVD processes may include trichlorosilane, silicon tetrachloride, hexachlorodisilane, trisilylamine (TSA), disilylamine (DSA), or other suitable material. In some embodiments, an ultraviolet (UV) curing process may be performed to cure the deposited isolation feature 206. In some instances illustrated in FIG. 2, the plurality of fins 204 may be completely covered by the isolation feature 206. Each of the second top layers 212 has an initial thickness $T_0$ along the Z direction. In some embodiments, the initial thickness $T_0$ is between about 10 nm and about 50 nm as measured from the first fin top layer 210.

Referring to FIG. 1, method 100 includes a block 104 to determine if the plurality of fins 204 is suitable for bent fins and if bent fins are needed. As will be described below, processes according to the present disclosure may bend two adjacent fins away from one another to increase a spacing therebetween. For example, the workpiece 200 in FIG. 2 includes two pairs of fins—a first pair 10 and a second pair 12. It is noted that while only two pairs of fins 204 are illustrated in FIG. 2, the present disclosure is not so limited and fully contemplates more fin pairs, evenly spaced fins, or unevenly spaced fins. Taking the first pair 10 of fins 204 for example, the two fins of the first pair 10 are spaced apart from one another by a first spacing 1000 (i.e. intra-pair spacing) and the first pair 10 is spaced apart from the second pair by a second spacing 2000 (i.e., inter-pair spacing). Because the mechanism to bend fins requires differentiated etch loading in a dense region and an isolated region, a sufficient difference between the first spacing 1000 and the second spacing 2000 may be needed. For example, when the first spacing 1000 is smaller than the second spacing 2000, the region including the first spacing 1000 is a dense region as compared to the region including the second spacing 2000, which is an isolated region by comparison. In addition, because the second spacing 2000 is greater than the first spacing 1000, fins bending into the second spacing 2000 do not impact the second spacing 2000 as much as they benefit the first spacing 1000. Put differently, operations at block 104 determine if the plurality of fins 204 is suitable for bent fins based on weighing pros and cons of implementing bent fins to the workpiece 200 in view of the design of the workpiece 200, subsequent processes and the final structure of the semiconductor device 200. Block 104 also determines whether bent fins are needed.

To determine if the plurality of fins 204 on the workpiece 200 are suitable for bent fins, a computing system may receive a design of the semiconductor device 200 in the form of graphic data system (GDS), GDSII files, or other suitable file types. The design of the semiconductor device 200 includes information of a spacing arrangement of the plurality of fins 204. The computing system may determine if the plurality of fins 204 are suitable for bent fins based on the spacing arrangement. For example, the computing system may identify fin pairs and compare intra-pair spacings and inter-pair spacings to see if the second spacing 2000 is sufficiently greater than the first spacing 1000. In some embodiments, the computing system may determine that the plurality of fins 204 are suitable for bent fins when the second spacing 2000 (i.e., inter-pair spacing) is at least about 1.3 times of the first spacing 1000 (i.e., intra-pair spacing). To avoid waste of space and to reduce device footprint, the second spacing 2000 may not be more than 3 times of the first spacing 1000. In one embodiment, operations at block 104 determine if the design of the semiconductor device 200 includes double-fin devices that are sufficiently spaced apart from one another. The determination at block 104 sets the course of subsequent operations in method 100. When it is determined that the plurality of fins 204 are not suitable for bent fins, method 100 may proceed from block 104 to block 106. When it is determined that the plurality of fins 204 are suitable for bent fins, method 100 may proceed from block 104 to block 108.

Figure 9A:
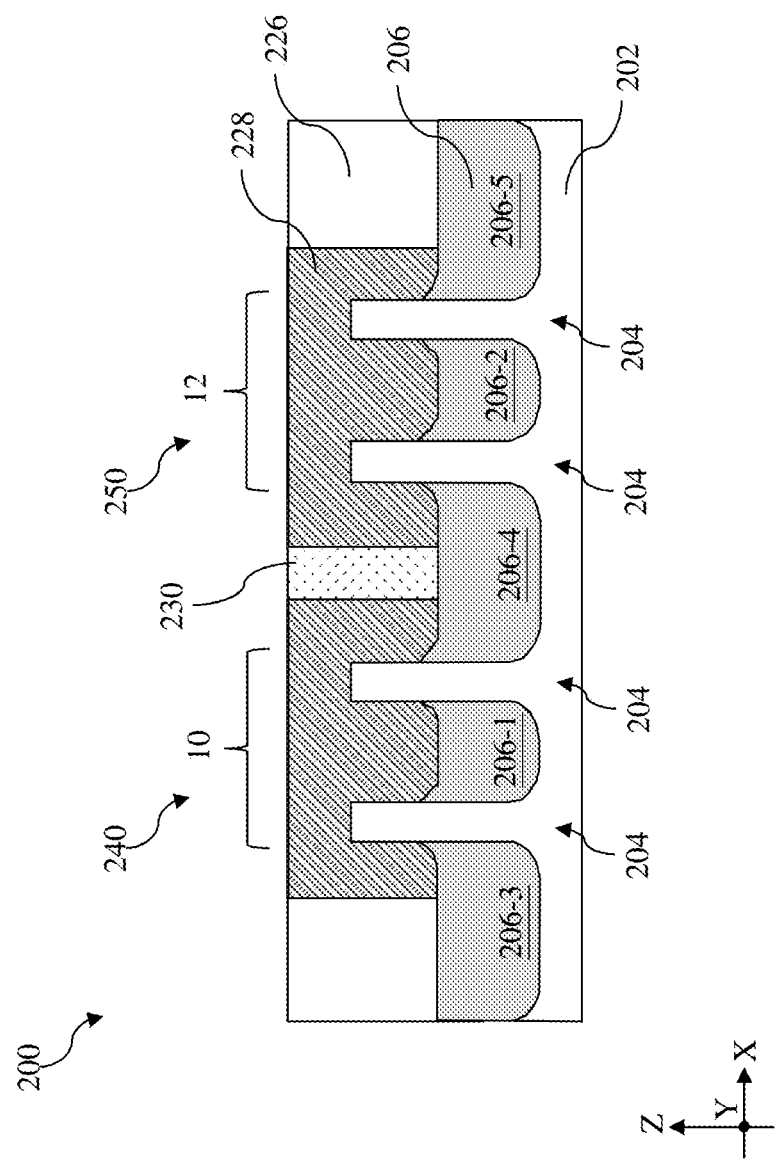
Figure 9B:
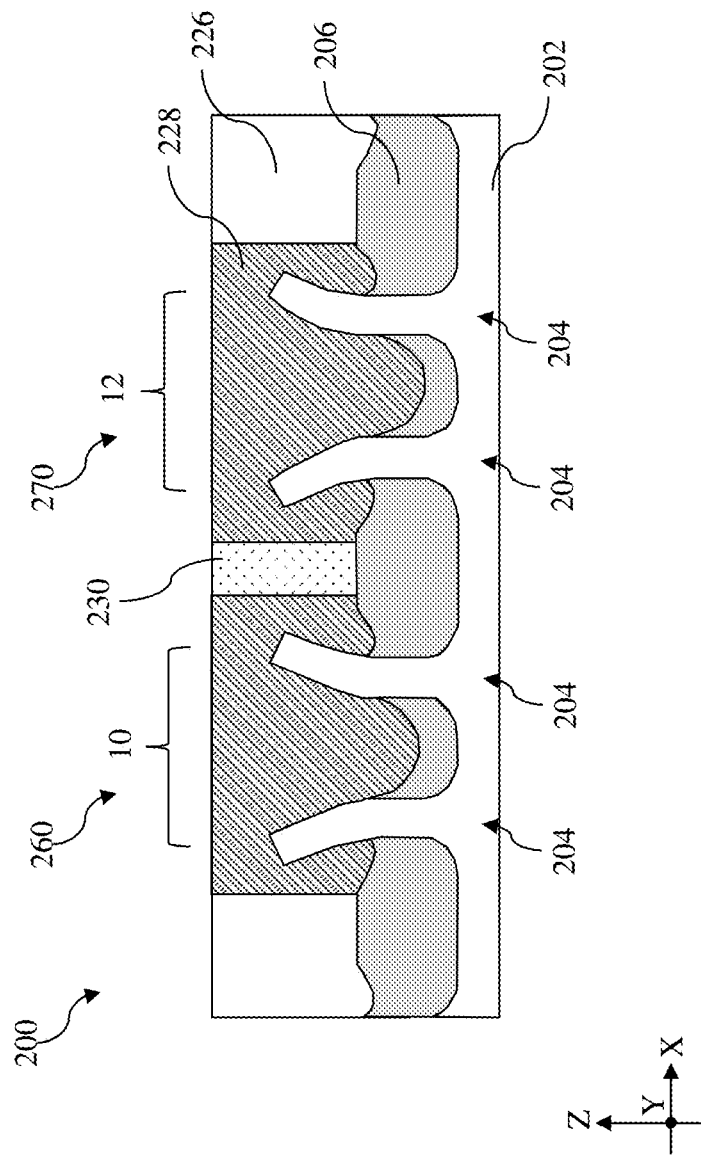

To determine if bent fins are needed, block 104 also takes into consideration the intra-pair spacing 1000 and the number of layers in the functional gate structure (such as the gate structure 228 shown in FIGS. 9A and 9B). In some embodiments, a computing system may receive a design of the semiconductor device 200 in the form of graphic data system (GDS), GDSII files, or other suitable file types. The design of the semiconductor device 200 includes information about the intra-pair spacings 1000 and the construction of the functional gate structure. The computing system may determine if the bent fins need needed, based on the intra-pair spacings 1000 and the construction of the functional gate structure. For example, the computing system may assess whether the intra-pair spacing 1000 is sufficient for forming the number of layers in the functional gate structure with acceptable yield or process window. For another example, the computing system may assess whether the intra-pair spacing 1000 is sufficient accommodate a thicker layer in the functional gate structure with acceptable yield or process window. In some instances, when the intra-pair spacing 1000 falls within a range between about 2 nm and about 10 nm, such as between about 3 nm and about 4 nm, certain high-k dielectric layers or work function layers may merge, blocking subsequent deposition of additional work function layers or metal fill layers. In some other instances, devices in different device regions may require different gate structures with different numbers of layers or different thicknesses of layers. In those instances, the computer system may determine that the intra-pair spacing may be sufficient for a type of device in one region but insufficient for another type of devices in a different region.

In some embodiments, method 100 may proceed from block 104 to block 106 if block 104 makes a negative determination in one of the two inquiries—whether the plurality of fins 204 on the workpiece 200 are suitable for bent fins and whether bent fins are needed. In the example where there are different types of devices in different regions, even though the plurality of fins 204 on the workpiece 200 are suitable for bent fins in both device areas, bent fins will not be implemented in a device region if bent fins are not needed for that device region. However, bent fins may still be implemented in another device region if bent fins are needed there. Method 100 may proceed from block 104 to block 108 if block 104 makes affirmative determinations to both of the inquiries—whether the plurality of fins 204 on the workpiece 200 are suitable for bent fins and whether bent fins are needed.

Figure 3A:
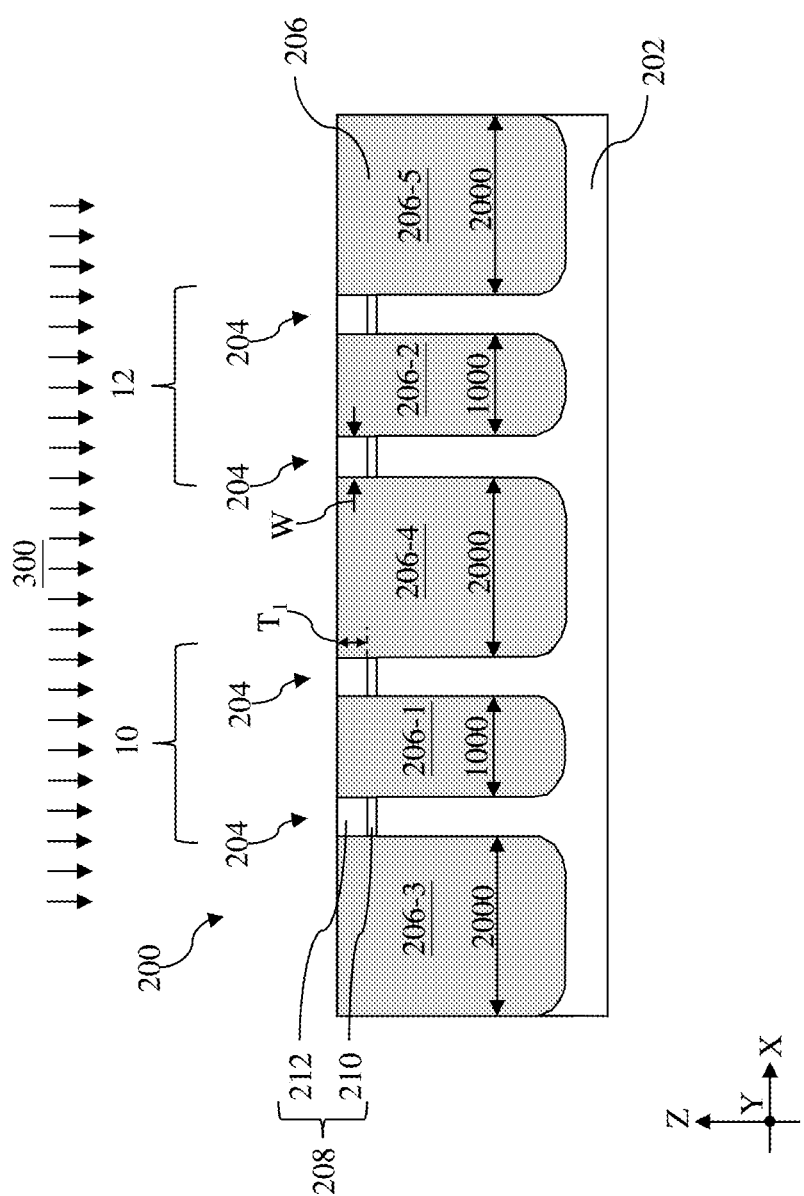

Referring to FIGS. 1 and 3A, method 100 includes a block 106 where a first planarization 300 is performed until the fin top layer reaches a first thickness ($T_1$) when it is determined at block 104 that the plurality of fins 204 is not suitable for bent fins or that bent fins are not needed. In some embodiments, the first planarization 300 may be a chemical mechanical polishing (CMP) process that reduces the initial thickness $T_0$ of the second fin top layer 212 to a first thickness $T_1$. In some implementations, the first thickness $T_1$ is between about 5 nm and about 25 nm. Each of the second fin top layer 212 over a fin 204 in FIG. 3A has a width W along the X direction. When viewed along the Y direction, each of the second fin top layer 212 over a fin 204 in FIG. 3A has a first aspect ratio calculated as $T_1$ divided by W ($T_1/W$). In some embodiments, the first aspect ratio is between about 0.3 and about 0.9. As the isolation feature 206 is planarized, it becomes divided by the plurality of fins 204 into different portions. For ease of reference, each portion of the isolation feature 206 is individually labeled. In FIG. 3A, the isolation feature 206 is divided into intra-pair isolation features 206-1 and 206-2 and inter-pair isolation features 206-3, 206-4, and 206-5. The intra-pair isolation features 206-1 and 206-2 respectively correspond to the intra-pair spacings 1000. The inter-pair isolation features 206-3, 206-4, and 206-5 respectively correspond to the inter-pair spacings 2000. Accordingly, a width of each of the inter-pair isolation features 206-3, 206-4, and 206-5 is greater than a width of each of the intra-pair isolation features 206-1 and 206-2.

Figure 3B:
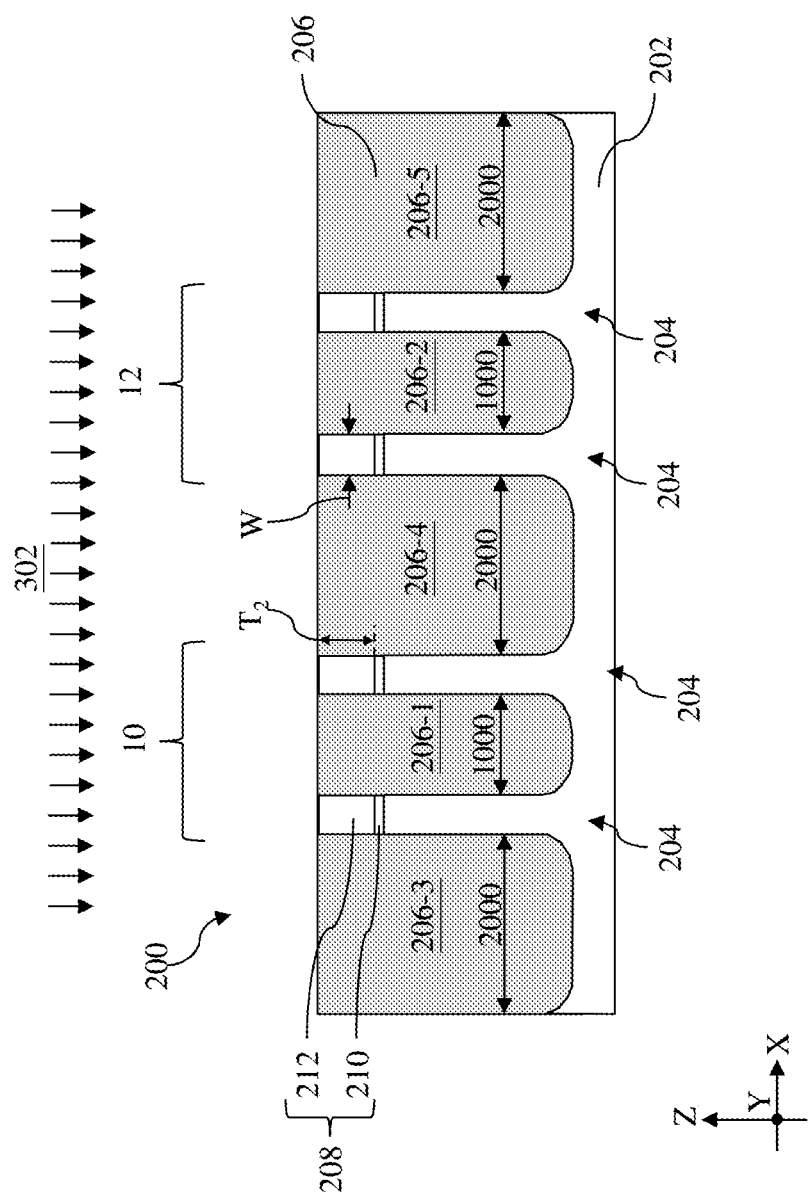

Referring to FIGS. 1 and 3B, method 100 includes a block 108 where a second planarization 302 is performed until the fin top layer reaches a second thickness ($T_2$) when it is determined at block 104 that the plurality of fins 204 is suitable for bent fins and bent fins are needed. In some embodiments, the second planarization 302 may be a CMP process that reduces the initial thickness $T_0$ of the second fin top layer 212 to a second thickness $T_2$. In some implementations, the second thickness $T_2$ is between about 5 nm and about 40 nm. In some instances, the second thickness $T_2$ may be greater than the first thickness $T_1$ by between about 5 nm and about 25 nm. Each of the second fin top layer 212 over a fin 204 in FIG. 3B has a width W along the X direction. When viewed along the Y direction, each of the second fin top layer 212 over a fin 204 in FIG. 3B has a second aspect ratio calculated as $T_2$ divided by W ($T_2/W$). In some embodiments, the second aspect ratio is equal to or greater than 1, such as between about 1 and about 2, to expose more sidewalls of the intra-pair isolation features 206-1 and 206-2. Similarly, as the isolation feature 206 is planarized, it becomes divided by the plurality of fins 204 into different portions. For ease of reference, each portion of the isolation feature 206 is individually labeled. In FIG. 3B, the isolation feature 206 is divided into intra-pair isolation features 206-1 and 206-2 and inter-pair isolation features 206-3, 206-4, and 206-5. The intra-pair isolation features 206-1 and 206-2 respectively correspond to the intra-pair spacings 1000. The inter-pair isolation features 206-3, 206-4, and 206-5 respectively correspond to the inter-pair spacings 2000. Accordingly, a width of each of the inter-pair isolation features 206-3, 206-4, and 206-5 is greater than a width of each of the intra-pair isolation features 206-1 and 206-2. In some instances, except for process duration, the first planarization 300 and the second planarization 302 may include similar etchants and process parameters. For example, the first planarization 300 lasts longer than the second planarization 302.

Figure 4A:
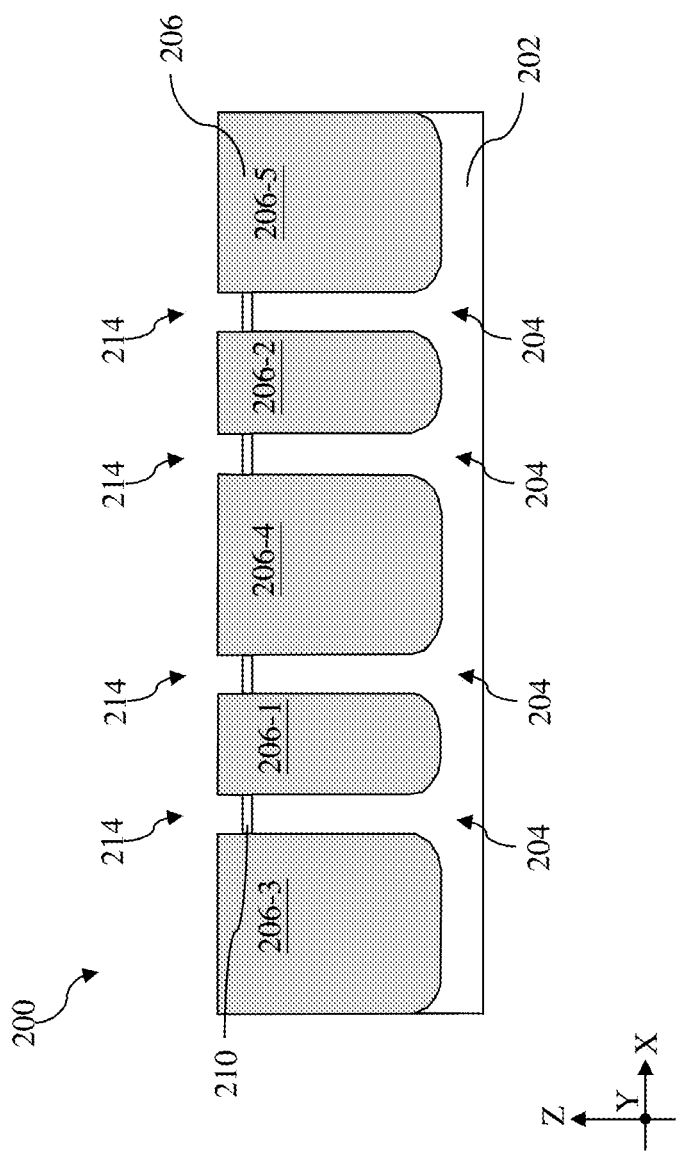
Figure 4B:
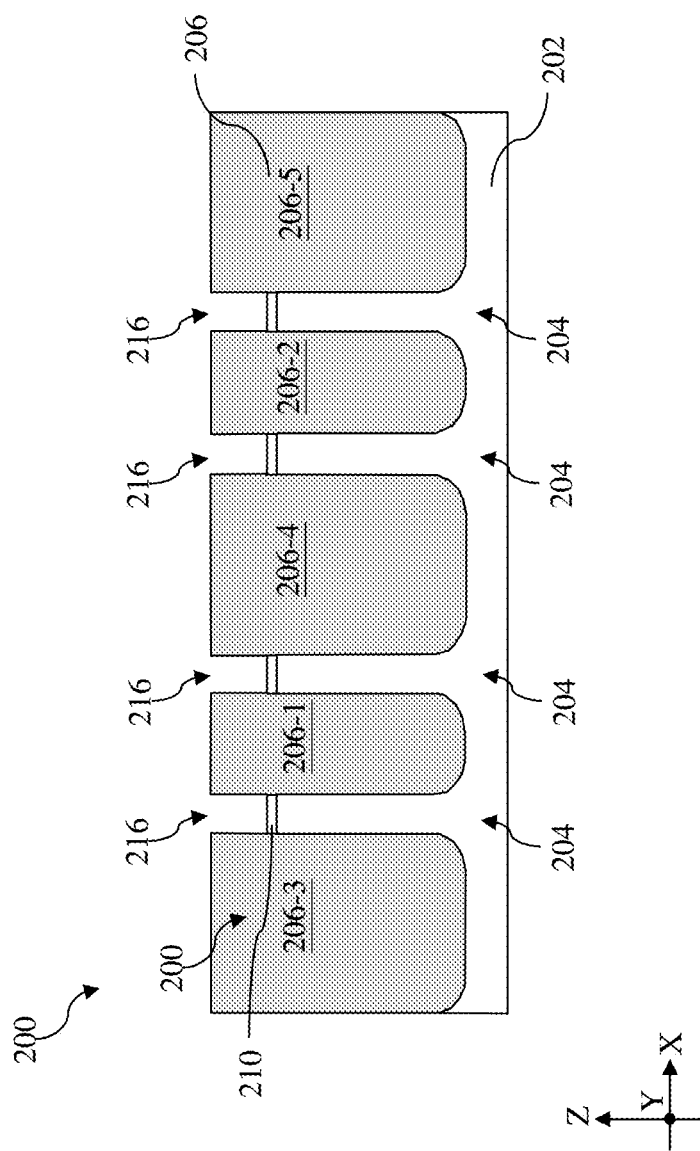

Referring to FIGS. 1, 4A and 4B, method 100 includes a block 110 where the second fin top layer 212 is selectively removed. In some embodiments, the first fin top layer 210 and the isolation feature 206 may be formed of similar material while the second fin top layer 212 and the isolation feature 206 may be formed different materials. For example, in one example, the second fin top layer 212 may be formed of silicon nitride while the first fin top layer 210 and the isolation feature 206 may be formed of silicon oxide. The second fin top layer 212 may be selectively removed using a dry etch process, a wet etch process, or a suitable process without substantially harming the isolation feature 206 and the first fin top layer 210. As shown in FIG. 4A, after the second fin top layer 212 having first thickness $T_1$ in FIG. 3A is selectively removed, first recesses 214 may be formed. Similarly, as shown in FIG. 4B, after the second fin top layer 212 having the second thickness $T_2$ in FIG. 3B is selectively removed, second recesses 216 may be formed. In embodiments illustrated in FIG. 4A, each of the first recesses 214 has a depth corresponding to the first thickness $T_1$. In embodiments illustrated in FIG. 4B, each of the second recesses 216 has a depth correspond to the second thickness $T_2$. Put differently, each of the second recesses 216 is deeper than each of the first recesses 214. As illustrated in FIG. 4B, the deeper second recesses 216 expose more of the sidewalls of the intra-pair isolation feature 206-1/206-2. As will be described below, the deeper second recesses 216 may result in faster etching of the intra-pair isolation features 206-1/206-2 as compared to the inter-pair isolation features 206-3, 206-4 and 206-5.

Figures 1, 5A:
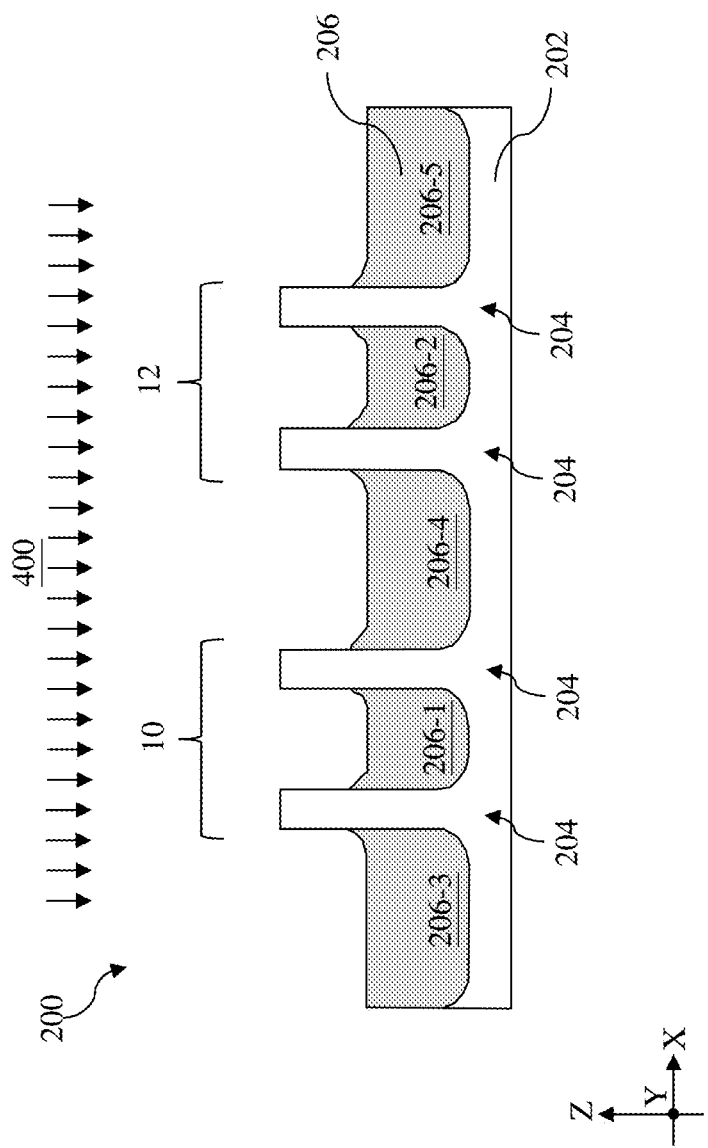
Figures 2, 5A:
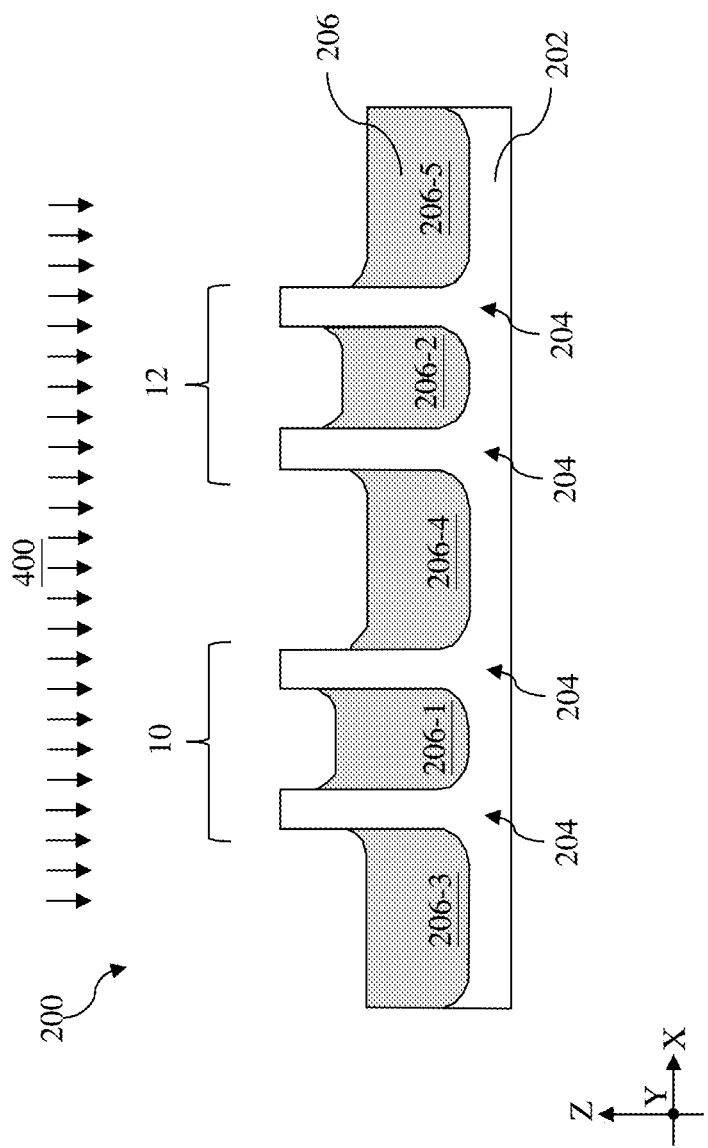
Figure 5B:
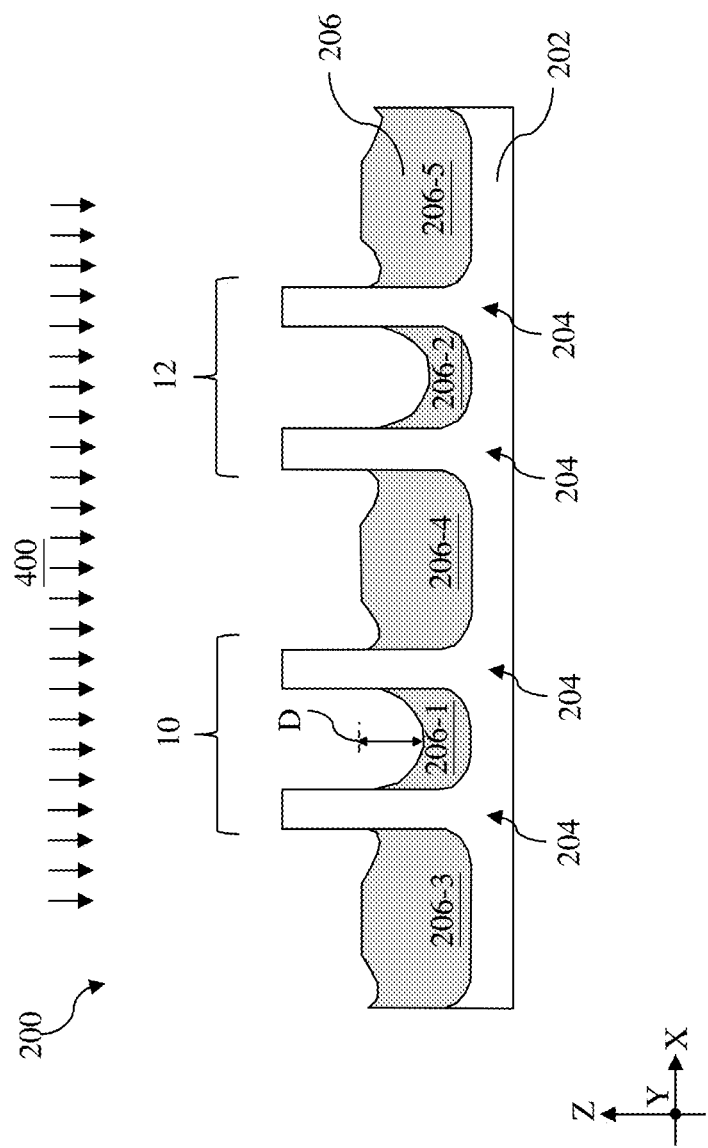

Referring to FIGS. 1, 5A-1, 5A-2, and 5B, method 100 includes a block 112 where the isolation feature 206 is etched back in an etch process 400. In some embodiments, the etch process 400 may be a dry etch process, a wet etch process, or a suitable isotropic etch process. In one embodiment, the etch process 400 may be a dry etch process that utilizes a mixture of hydrogen fluoride (HF) and ammonia ($NH_3$). FIGS. 5A-1 and 5A-2 illustrate etching back of the workpiece 200 shown FIG. 4A. FIG. 5B illustrates etching back of the workpiece 200 shown in FIG. 4B. Depending on a ratio between concentration of the etchant mixture in the etch process 400, the isolation feature 206 may have different profiles after the etch process 400. For example, when a ratio of hydrogen fluoride concentration to ammonia ([HF]/[$NH_3$]) is about 0.2 (i.e., ammonia-rich), the etching loading among dense regions and isolated regions may not be apparent and the isolation features 206-1, 206-2, 206-3, 206-4, and 206-5 in FIG. 5A-1 may be substantially coplanar. To be more precise, the lowest points of the isolation features 206-1, 206-2, 206-3, 206-4, and 206-5 in FIG. 5A-1 may be on the same plane. For another example, when a ratio of hydrogen fluoride concentration to ammonia ([HF]/[$NH_3$]) is about 5 (i.e., hydrogen fluoride-rich), the etching loading among dense regions and isolated regions may be apparent and top surfaces of the intra-pair isolation features 206-1 and 206-2 may be higher than top surfaces of the inter-pair isolation features 206-3, 206-4, and 206-5, as illustrated in FIG. 5A-2. For the avoidance of any doubts, the relative terms of "higher" or "lower" are with respect to the Z direction shown in FIGS. 5A-1 and 5A-2.

When it is determined that bent fins are to be implemented at block 104, the etch process 400 may etch the intra-pair isolation features 206-1 and 206-2 faster and result in an isolation feature profile shown in FIG. 5B. As shown in FIG. 5B, top surfaces of the inter-pair isolation features 206-3, 206-4 and 206-5 are higher than top surfaces of the intra-pair isolation features 206-1 and 206-2 by a distance D along the Z direction. In some instances, the distance D is between about 3 nm and about 5 nm.

Figures 1, 6A:
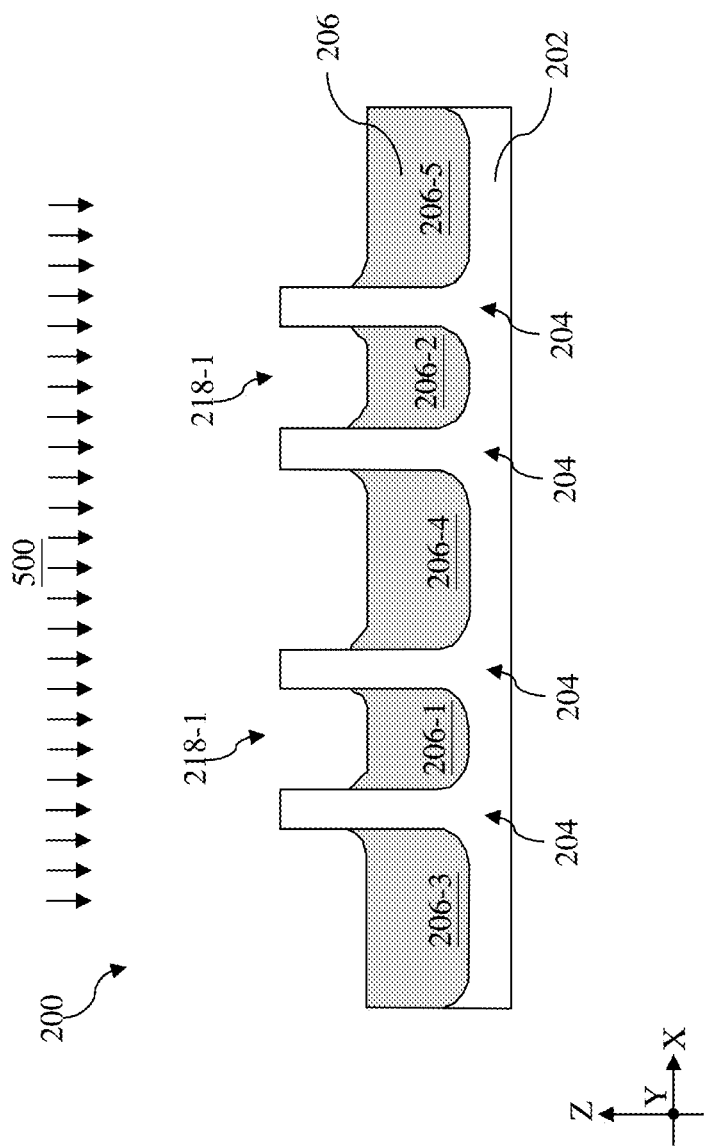
Figures 2, 6A:
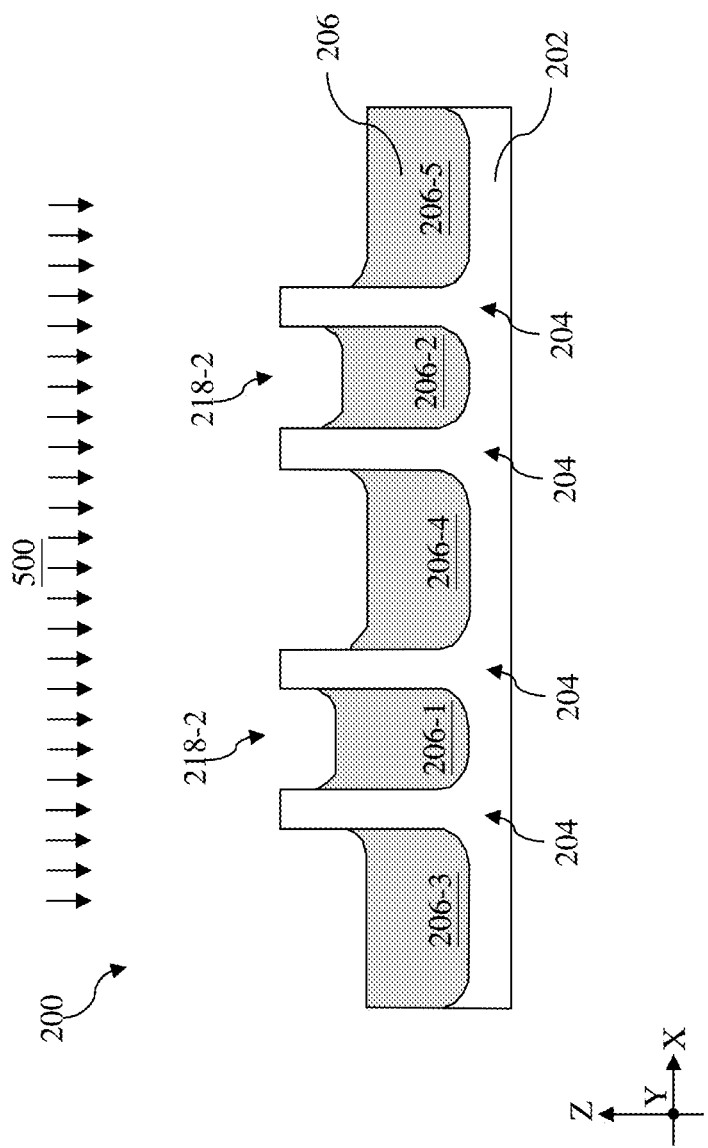
Figure 6B:
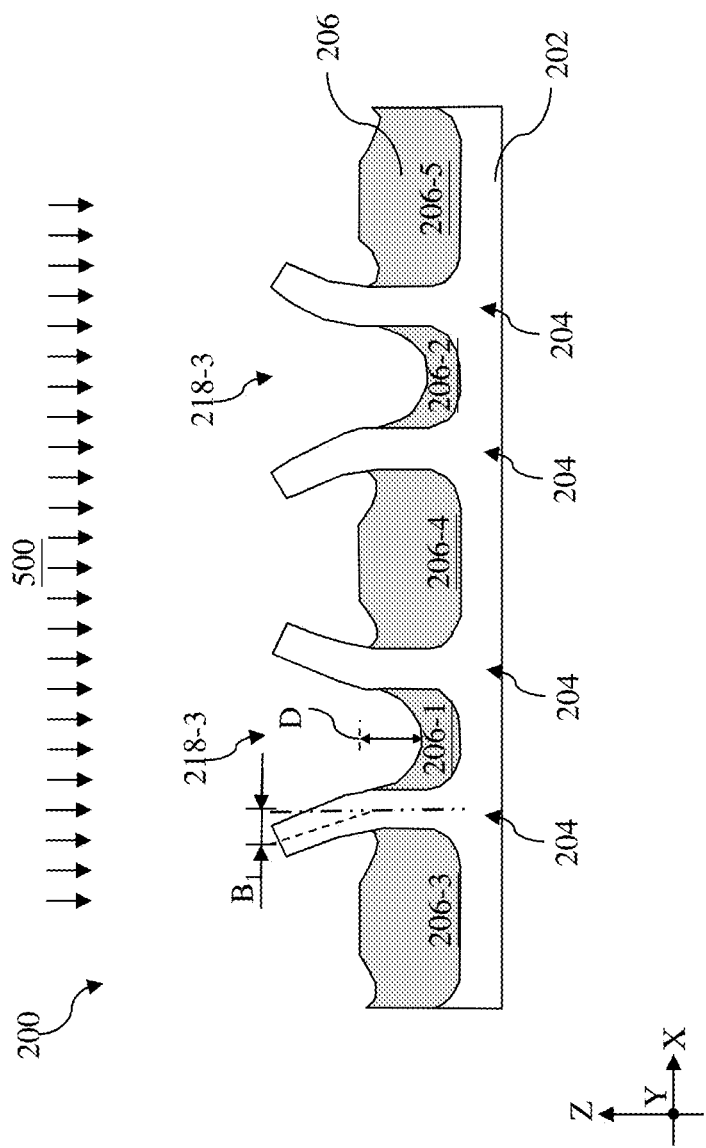

Referring to FIGS. 1, 6A-1, 6A-2, and 6B, method 100 includes a block 114 where the workpiece 200 is annealed in an anneal process 500. In some embodiments, the anneal process 500 may be a rapid thermal anneal (RTA) process, a laser spike anneal process, a flash anneal process, a furnace anneal process, or other suitable anneal processes. In some implementations, the anneal process 500 may include an anneal temperature between about 450° C. and about 900° C. In some implementations where the plurality of fins 204 include germanium, the anneal process 500 may include a lower anneal temperature between 450° C. and about 600° C. to avoid undesirable germanium diffusion. The anneal process 500 may cause the isolation feature 206 to exert a tensile stress on the plurality of fins 204. In embodiments where bent fins are not implemented, the intra-pair isolation features (206-1 and 206-2) and inter-pair isolation features (206-3, 206-4, and 206-5) are either coplanar as shown in FIG. 6A-1 or include moderate height difference as shown in FIG. 6A-2. In those embodiments, the tensile stress exerted on the plurality of fins 204 by the isolation feature 206 may not be sufficient to cause bending. However, in embodiments where bent fins are implemented, the intra-pair isolation features (206-1 and 206-2) are lower than the inter-pair isolation features (206-3, 206-4, and 206-5). In these embodiments, the higher inter-pair isolation features (206-3, 206-4, and 206-5) may pull fins in the first pair 10 and the second pair 12 away from each other as shown in FIG. 6B. As illustrated in FIG. 6B, a center point of a top surface of the fin 204 may be shifted horizontally along the X direction by a first bending amount $B_1$. In some instances, the first bending amount $B_1$ is between 0.3 nm and about 1.5 nm. As compared to first intra-pair openings 218-1 in FIG. 6A-1 and second intra-pair openings 218-2 in FIG. 6A-2, the third intra-pair openings 218-3 in FIG. 6B have an increased top opening. In one embodiment, a top opening of the third intra-pair opening 218-3 is greater than a top opening of the first intra-pair opening 218-1 or a top opening of the second intra-pair opening 218-2 by twice the first bending amount $B_1$ ($2B_1$), which is between about 0.6 nm and about 3 nm. This wider top opening can facilitate filling in of dummy gate materials, removal of dummy gate materials, and filling in of functional gate materials.

Figure 7A:
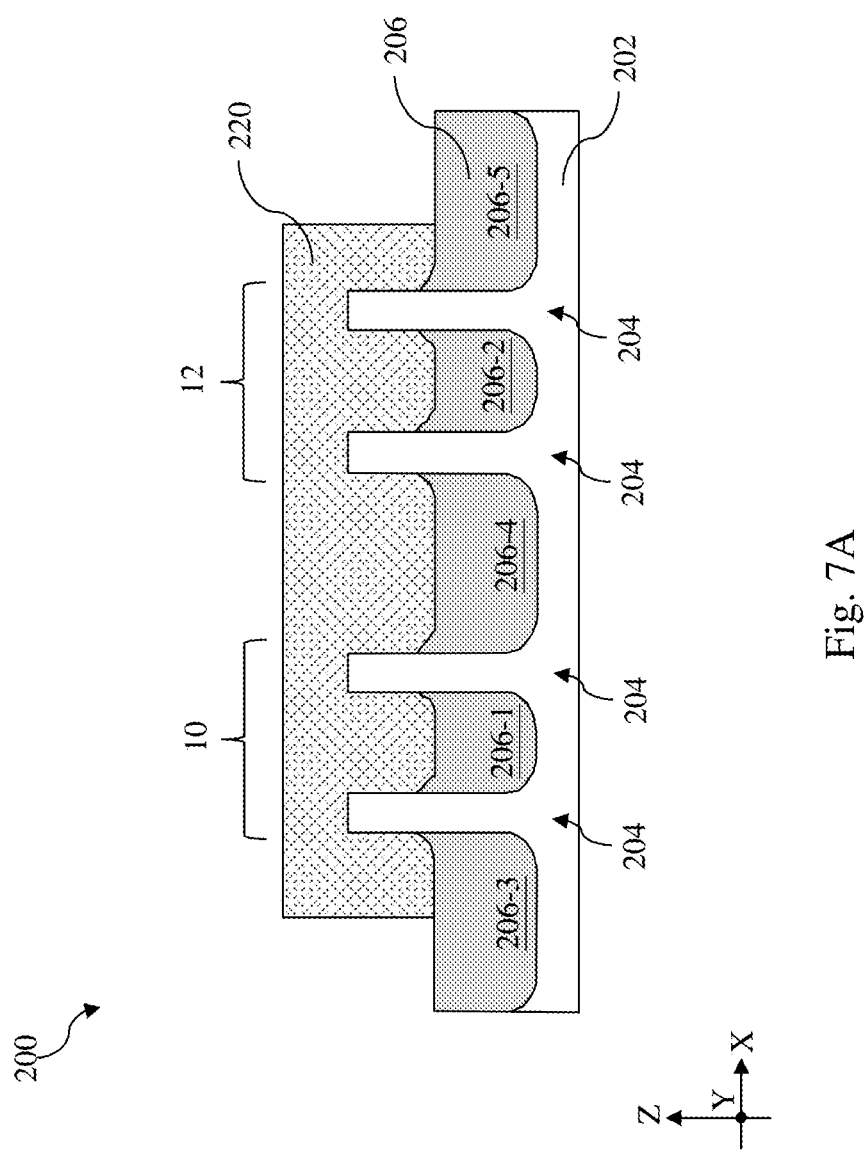
Figure 7B:
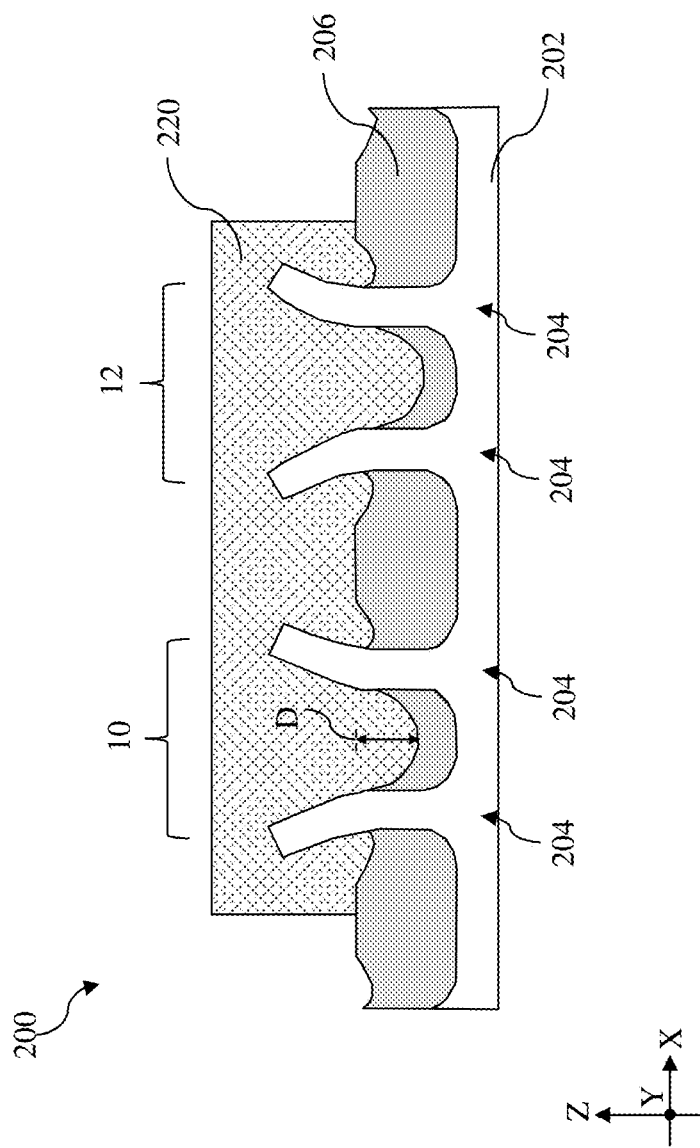
Figure 8A:
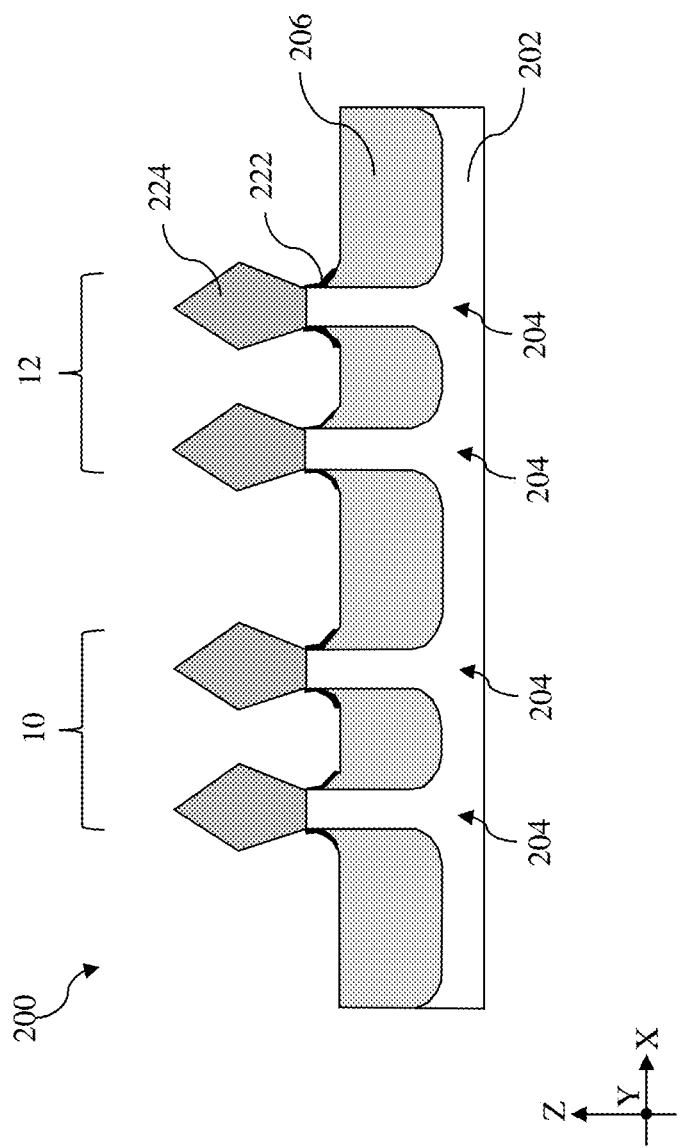
Figure 8B:
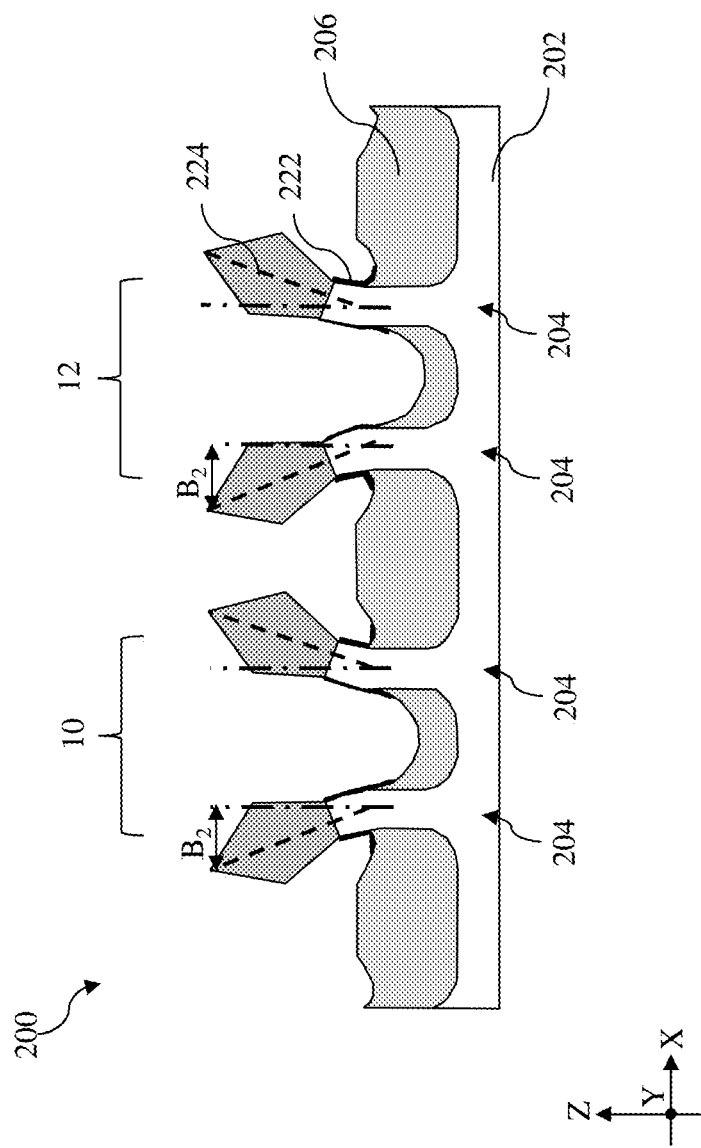

Referring to FIGS. 1, 7A, 7B, 8A, 8B, 9A, and 9B, method 100 includes a block 116 where further processes are performed. Such further processes include formation of dummy gate stacks 220, formation of gate spacers 222 over the dummy gate stacks, formation of source/drain recesses, formation of source/drain features 224, formation of an interlayer dielectric (ILD) layer over the workpiece 200, and formation of functional gate structures. FIGS. 7A, 7B, 9A, and 9B are fragmentary cross-sectional views along channel regions of the plurality of fins 204. FIGS. 8A and 8B are fragmentary cross-sectional views along source/drain regions of the plurality of fins 204.

Referring first to FIGS. 7A and 7B, dummy gate stacks 220 may be formed over channel regions of the plurality of fins 204. As shown in FIGS. 7A and 7B, the wider third intra-pair openings 218-3 (shown in FIG. 6B) facilitate filling of the dummy gate stack between the fins in the first pair 10 and the second pair 12. In some implementations, a dummy gate dielectric layer is first formed over the workpiece 200 before the deposition of the dummy gate stack 220. The dummy gate dielectric layer may include silicon oxide. In some instances, the dummy gate stacks 220 may be formed of polysilicon. Subsequent to the formation of the dummy gate stacks 220, a gate spacer 222 (partially shown in FIGS. 8A and 8B) may be formed over the dummy gate stacks 220 as well as source/drain regions of the plurality of fins 204. As shown in FIGS. 8A and 8B, the gate spacer 222 extends along sidewalls of the source/drain regions of the plurality of fins 204. The source/drain regions of the plurality of fins 204 are then recessed and source/drain features 224 are then formed over the recessed source/drain regions. Due to the bending of the fins 204 in FIG. 8B, the source/drain features 224 over each of the first pair 10 and the second pair 12 may also bend away from each other. In some implementations, a center point of a top surface of each of the source/drain feature 224 may be may be shifted horizontally along the X direction by a second bending amount $B_2$. Because the source/drain features 224 may be formed taller than the fins 204, the second bending amount $B_2$ may be equal to or greater than the first bending amount $B_1$. In one example, the second bending amount $B_2$ may be between about 0.3 nm and about 3 nm. As compared to the bent source/drain features 224 over bent fins 204 in FIG. 8B, substantially perpendicular source/drain features 224 are formed over substantially perpendicular fins 204 when bent fins are not implemented.

Reference is now made to FIGS. 9A and 9B. After formation of the source/drain features 224, a dielectric layer 226 is deposited over the workpiece 200. The dielectric layer 226 may be an interlayer dielectric (ILD) layer. The dielectric layer 226 may be a silicon oxide or silicon oxide containing material where silicon exists in various suitable forms. As an example, the ILD layer includes silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOC), spin-on silicon based polymeric dielectrics, or combinations thereof. A planarization ensues to expose the dummy gate stack 220. The exposed dummy gate stack 220 is then selectively removed to form gate trenches.

Functional gate structures 228 are formed over channel regions of the plurality of fins 204. As illustrated in FIGS. 9A and 9B, the functional gate structures 228 extend lengthwise along X direction. While not shown in FIGS. 9A and 9B, each of the functional gate structures 228 includes an interfacial layer, a gate dielectric layer, one or more work function layers, and a metal fill layer. In some embodiments, the interfacial layer may include a dielectric material such as silicon oxide layer or silicon oxynitride. The gate dielectric layer is formed of a high-k (dielectric constant greater than about 3.9) dielectric material that may include $HfO_2$, $TiO_2$, HfZrO, $Ta_2O_3$, $HfSiO_4$, $ZrO_2$, $ZrSiO_2$, combinations thereof, or other suitable materials. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicon carbide, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten, ruthenium, cobalt or copper. Because the gate dielectric layer is formed of high-k dielectric material and the use of metal in functional gate structures 228, functional gate structures 228 may also be referred to high-k metal gate structures 228 or metal gate structures 228. Depending on the design of the semiconductor device 200, the functional gate structure 228 may be divided into more than one segment. In the example shown in FIGS. 9A and 9B, the functional gate structure 228 may be divided into two segments by a gate cut feature 230. The gate cut feature 230 may be formed as a result of a gate cut process where the functional gate structure 228 may be etched to form a gate cut trench and the gate cut trench is filled with a dielectric material to form the gate cut feature 230.

Reference is still made to FIGS. 9A and 9B, at conclusion of the fabrication process, a first FinFET transistor 240 and a second FinFET transistor 250 may be formed over the workpiece 200 when bent fins are not implemented, and a third FinFET transistor 260 and a fourth FinFET transistor 270 may be formed over the workpiece 200 when bent fins are implemented. As shown in FIG. 9B, each of the third FinFET transistor 260 and the fourth FinFET transistor 270 may be a double-fin (or dual fin) FinFET that are formed over a pair of fins (i.e., the first pair 10 and the second pair 12). The pair of fins in each of the third FinFET transistor 260 and the fourth FinFET transistor 270 bend away from each other due to tensile stress exerted by annealed isolation features. As described above, the bending of the fins increases the spacing between the pair of fins and facilitates the filling in of dummy gate materials, removal of the dummy gate stacks 220, and formation of the functional gate structures 228.

Figure 10:
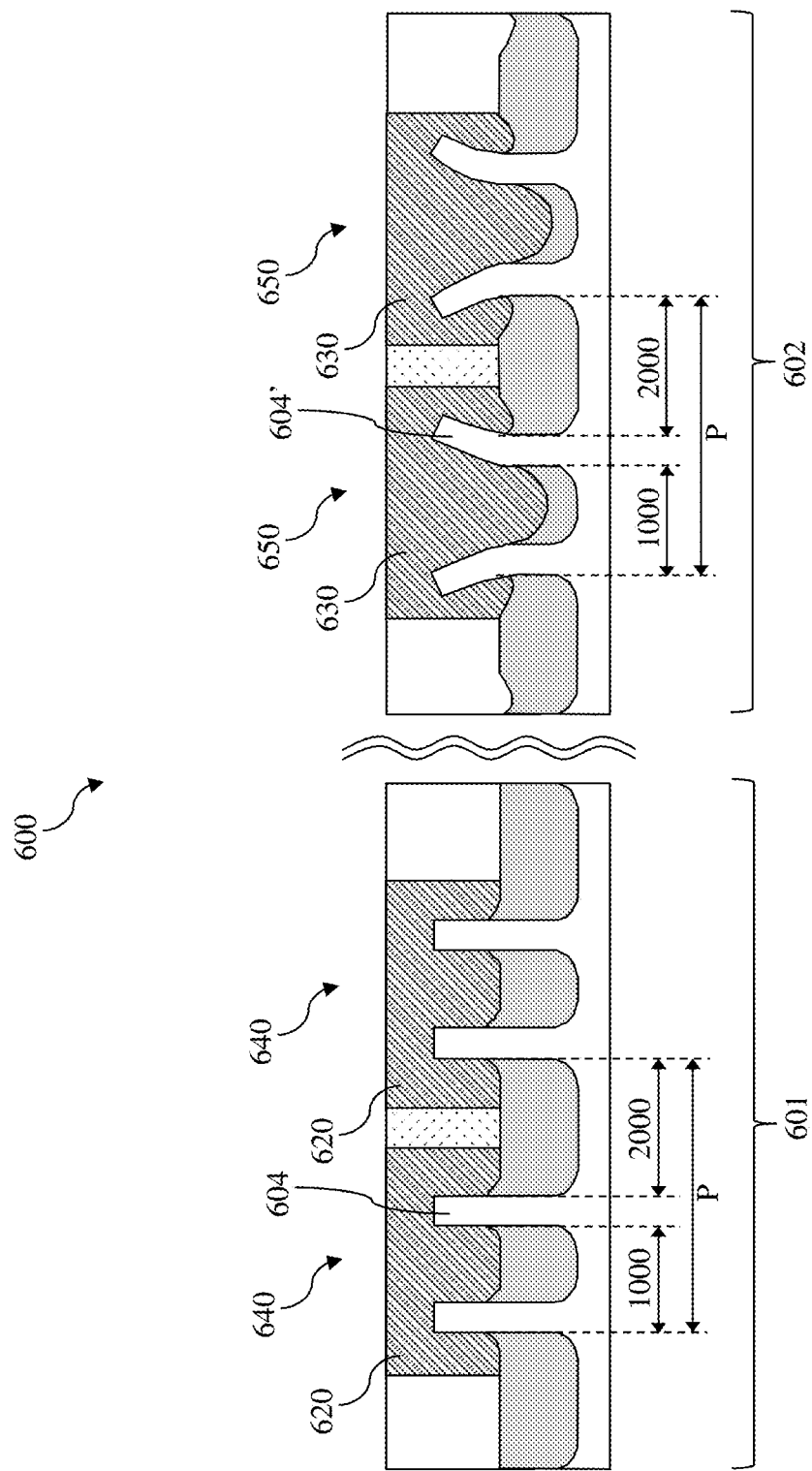
FIG. 10 is a fragmentary schematic cross-sectional view of a semiconductor device that includes two device regions, according to various aspects of the present disclosure.

FIG. 10 illustrates a fragmentary cross-sectional view of a semiconductor device 600 that includes a first device area 601 and a second device area 602. In some embodiments, the first device area 601 and the second device area 602 may be an n-type device area and a p-type device area, respectively. In some other embodiments, the first device area 601 and the second device area 602 may be a p-type device area and an n-type device area, respectively. In still other embodiments, the first device area 601 includes devices having a first threshold voltage and the second device area 602 includes devices having a second threshold voltage different from the first threshold voltage. As shown in FIG. 10, the semiconductor device 600 includes straight-fin devices 640 in the first device area 601 and bent-fin devices 650 in the second device area 602. Both the straight-fin devices 640 and the bent-fin devices 650 may be fabricated using method 100 described above. Each of the straight fin devices 640 in the first device area 601 includes a first gate structure 620 disposed over two straight fins 604 and each of the bent fin devices 650 in the second device area 602 includes a second gate structure 630 disposed over two bent fins 604'. Here, the straight fins 604 refer to fins that are not intentionally bent using methods similar to method 100.

In the depicted embodiments, because the bent fins 604' are fabricated from straight fins 604, the spacing arrangements for the first device area 601 and the second device area 602 are substantially the same. As shown in FIG. 10, with the exception of the bending aspects, the straight fins 604 and bent fins 604' share substantially the same intra-pair spacing 1000, inter-pair spacing 2000, and a pitch P. That is, FIG. 10 illustrates an embodiment where the straight fins 604 are suitable for bent fins but bent fins are only needed in the second device area 602, but not in the first device area 601. According to the operations described above with respect to block 104 of method 100, bent fins 604' are only implemented in the second device area 602 but not in the first device area 601. In the embodiments represented in FIG. 10, the first gate structure 620 and second gate structure 630 have different constructions. For example, the second gate structure 630 may include at least one additional gate dielectric layer, at least one additional work function layer, a thicker gate dielectric layer, or a thicker work function layer, as compared to the first gate structure 620. In the depicted embodiment, the additional or thicker layer of the second gate structure 630 justifies the need to implement bent fins 604' to improve process window or yield.

Processes of the present disclosure provide benefits. An example process according to the present disclosure includes operations to determine whether a design of a semiconductor device is suitable for implementation of bent fins and whether bent fins are needed, based on a spacing arrangement of fins of the semiconductor device. When the design is determined to be suitable for implementation of bent fins and bent fins are needed to realize the design, a thickness of a fin top layer and an etch back of an isolation feature may be selected such that the isolation feature between two adjacent fins in a fin pair is lower than the isolation feature in an isolated region. A subsequent anneal process causes a tensile stress on the fin pair, pulling the fins apart from each other to form bent fins. The increased opening between bent fins increases the process windows for filling in of dummy gate materials, removal of dummy gate stacks, and filling in of functional gate structures.

The present disclosure provides for many different embodiments. In one embodiment, a semiconductor device is provided. The semiconductor device includes a first fin extending along a first direction, a second fin extending parallel to the first fin, and a gate structure over and wrapping around the first fin and the second fin. The gate structure extends along a second direction perpendicular to the first direction. The first fin bends away from the second fin along the second direction and the second fin bends away from the first fin along the second direction.

In some embodiments, the semiconductor device further includes a first isolation feature adjacent to the first fin and away from the second fin, a second isolation feature disposed between the first fin and the second fin, and a third isolation feature adjacent to the second fin and away from the first fin. A top surface of the second isolation feature is lower than top surfaces of the first isolation feature and the third isolation feature. In some implementations, the semiconductor device further includes a third fin spaced apart from the first fin by the first isolation feature. A width of the first isolation feature along the second direction is greater than a width of the second isolation feature along the second direction. In some embodiments, the top surface of the second isolation feature is lower than top surfaces of the first isolation feature and the third isolation feature by a difference between about 3 nm and about 5 nm. In some instances, the first fin and the second fin include germanium. In some implementations, the first fin and the second fin include at least one double-fin device.

In another embodiment, a method is provided. The method includes providing a workpiece that includes a plurality of fins embedded in an isolation feature, each of the plurality of fins including a fin top layer, determining if the plurality of fins is suitable for implementation of bent fins and if bent fins are needed, performing a first planarization process to the workpiece until the fin top layer reaches a first thickness when spacing arrangement is not suitable for implementation of bent fins or when bent fins are not needed, and performing a second planarization process to the workpiece until the fin top layer reaches a second thickness when spacing arrangement is suitable for implementation of bent fins and bent fins are needed. The second thickness is greater than the first thickness.

In some embodiments, the determining includes receiving a design of the semiconductor device where the design include a spacing arrangement of the plurality of fins and determining if the plurality of fins is suitable for implementation of bent fins and if bent fins are needed based on the spacing arrangement. In some embodiments, the providing of the workpiece includes forming the plurality of fins on a substrate and depositing the isolation feature using a flowable chemical vapor deposition (FCVD) process. In some implementations, each of the plurality of fins includes a semiconductor fin, a semiconductor oxide layer on the semiconductor fin, and the fin top layer on the semiconductor oxide layer. The fin top layer includes silicon nitride. In some implementations, a difference between the second thickness and the first thickness is between about 3 nm and about 5 nm. In some instances, the method may further include selectively removing the fin top layer, after the selective removing of the fin top layer, etching back the isolation feature, and annealing the workpiece. In some embodiments, the annealing of the workpiece includes an annealing temperature between about 450° C. and about 600° C. In some implementations, the etching back includes use of hydrogen fluoride (HF) and ammonia ($NH_3$).

In yet another embodiment, a method is provided. The method includes providing a workpiece including a plurality of pairs of fins embedded in an isolation feature, wherein each of the plurality of pairs of fins includes two fins spaced apart from each other by a first spacing, each of the plurality of pairs of fins is spaced part from an adjacent one of the plurality of pairs of fins by a second spacing, and each of the plurality of pairs of fins includes a fin top layer, planarizing the workpiece until an aspect ratio of the fin top layer is equal to or greater than 1, selectively removing the fin top layer, etching back the isolation feature, and annealing the workpiece. The second spacing is greater than the first spacing.

In some embodiments, the plurality of pairs of fins include germanium and silicon. In some implementations, the fin top layer is formed of silicon nitride. In some implementations, the annealing of the workpiece includes an annealing temperature between about 450° C. and about 600° C. In some instances, the etching back include use of hydrogen fluoride (HF) and ammonia ($NH_3$). In some embodiments, a ratio of hydrogen fluoride to ammonia is between about 0.2 and about 5.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a semiconductor device, comprising:
   providing a workpiece that includes a plurality of fins embedded in an isolation feature, each of the plurality of fins including a fin top layer;
   determining if the plurality of fins is suitable for implementation of bent fins and if bent fins are needed;
   performing a first planarization process to the workpiece until the fin top layer reaches a first thickness when spacing arrangement is not suitable for implementation of bent fins or when bent fins are not needed; and
   performing a second planarization process to the workpiece until the fin top layer reaches a second thickness when spacing arrangement is suitable for implementation of bent fins and bent fins are needed,
   wherein the second thickness is greater than the first thickness.

2. The method of claim 1, where the determining comprises:

receiving a design of the semiconductor device, the design comprising a spacing arrangement of the plurality of fins; and determining if the plurality of fins is suitable for implementation of bent fins and if bent fins are needed based on the spacing arrangement.

3. The method of claim 1, wherein the providing of the workpiece comprises:

forming the plurality of fins on a substrate; and depositing the isolation feature using a flowable chemical vapor deposition (FCVD) process.

4. The method of claim 1, wherein each of the plurality of fins comprises:

a semiconductor fin;

a semiconductor oxide layer on the semiconductor fin; and the fin top layer on the semiconductor oxide layer, wherein the fin top layer comprises silicon nitride.

5. The method of claim 1, wherein a difference between the second thickness and the first thickness is between about 3 nm and about 5 nm.

6. The method of claim 1, further comprising:

selectively removing the fin top layer;

after the selective removing of the fin top layer, etching back the isolation feature; and annealing the workpiece.

7. The method of claim 6, wherein the annealing of the workpiece comprises an annealing temperature between about 450° C. and about 600° C.

8. The method of claim 6, wherein the etching back comprises use of hydrogen fluoride (HF) and ammonia ($NH_3$).

9. A method, comprising:

providing a workpiece comprising a plurality of pairs of fins embedded in an isolation feature, wherein each of the plurality of pairs of fins comprises two fins spaced apart from each other by a first spacing, each of the plurality of pairs of fins is spaced part from an adjacent one of the plurality of pairs of fins by a second spacing, and each of the plurality of pairs of fins includes a fin top layer;

planarizing the workpiece until a top surface of the isolation feature and top surfaces of the plurality of pairs of fins are coplanar and an aspect ratio of the fin top layer is equal to or greater than 1;

after the planarizing, selectively removing the fin top layer such that top surfaces of the plurality of pairs of fins are lower than the top surface of the isolation feature;

after the selectively removing, etching back the isolation feature; and annealing the workpiece, wherein the second spacing is greater than the first spacing.

10. The method of claim 9, wherein the plurality of pairs of fins comprise germanium and silicon.

11. The method of claim 9, wherein the fin top layer is formed of silicon nitride.

12. The method of claim 9, wherein the annealing of the workpiece comprises an annealing temperature between about 450° C. and about 600° C.

13. The method of claim 9, wherein the etching back comprises use of hydrogen fluoride (HF) and ammonia ($NH_3$).

14. The method of claim 13, wherein a ratio of hydrogen fluoride to ammonia is between about 0.2 and about 5.

15. A method, comprising:

forming a first fin, a second fin, a third fin, and a fourth fin on a substrate, wherein the first fin and the second fin is spaced apart by a first spacing, the second fin and the third fin are spaced apart by a second spacing greater than the first spacing, and the third fin and the fourth fin are spaced apart by the first spacing;

depositing an isolation layer over the first fin, the second fin, the third fin, and the fourth fin;

etching back the isolation layer such that the isolation layer between the first fin and the second fin or between the third fin and the fourth fin is lower than the isolation layer between the second fin and the third fin; and after the etching back, performing an anneal process to bend the first fin and the second fin away from one another and bend the third fin and the fourth fin away from one another.

16. The method of claim 15, wherein, after the forming, a top surface of each of the first fin, the second fin, the third fin, and the fourth fin is capped by a first fin-top layer and a second fin-top layer over the first fin-top layer.

17. The method of claim 16, further comprising:

after the depositing of the isolation layer, planarizing the isolation layer until the second fin-top layer is exposed.

18. The method of claim 17, further comprising:

selectively removing the second fin-top layer without substantially etching away the first fin-top layer.

19. The method of claim 15, wherein the etching back comprises use of hydrogen fluoride (HF) and ammonia ($NH_3$).

20. The method of claim 15, wherein the first fin, the second fin, the third fin, and the fourth fin comprise germanium, wherein the anneal process comprises a temperature between about between 450° C. and about 600° C.

* * * * *